United States Patent [19]

Henden

[11] Patent Number: 4,779,060

[45] Date of Patent: Oct. 18, 1988

[54] LINEAR POWER AMPLIFYING SYSTEM

[75] Inventor: James Henden, Sunnyvale, Calif.

[73] Assignees: Gentron Corporation, Milwaukee, Wis.; Quantel International Inc., Santa Clara, Calif.

[21] Appl. No.: 56,863

[22] Filed: Jun. 1, 1987

[51] Int. Cl.[4] .............................................. H03F 3/16
[52] U.S. Cl. ................................. 330/277; 330/124 R; 330/295
[58] Field of Search ................. 330/10, 124 D, 124 R, 330/207 A, 207 P, 251, 277, 295, 296, 298

[56] References Cited

U.S. PATENT DOCUMENTS 4,247,824  1/1981  Hilbourne ........................... 330/253
4,554,512  11/1985  Aiello ..................................... 330/10

OTHER PUBLICATIONS

"Paralleling of Power MOSFETS in Linear Applications" by Kim Gauen of Motorola, Inc., Semiconductor Product Sector, Phoenix, Ariz.

Primary Examiner—Eugene R. LaRoche
Assistant Examiner—Steven J. Mottola
Attorney, Agent, or Firm—Andrus, Sceales, Starke & Sawall

[57] ABSTRACT

A power MOSFET linear amplifier includes a plurality of paralleled MOSFETS having a gate-to-source resistor to ensure simultaneous turn-on and sharing of the load current. An arc lamp is connected in series with a 400 volt power supply and a variable ballast element in the form of the power MOSFET linear amplifier. The linear amplifier includes four similar modules. Each module is a hybrid circuit constructed with eight MOSFETs connected in parallel. Each MOSFET includes a similar gate-to-source resistor in addition to an appropriate gate resistor and source resistor. Under operating load current conditions, the gate-to-source resistors are laser trimmed to establish precise equalized current sharing in response to the specified operating input voltages. The module is set with the gate voltage slightly above the operating threshold voltage range of the MOSFET. The modules then operate with the essentially simultaneous turn-on of all MOSFETs and in a reliable balancing of current between the several MOSFET devices. The modules are fabricated with a common heat sink and an appropriate packaging for rapid dissipation of the heat, to thereby maintain the necessary low operating temperature which is essential to reliable operation of the MOSFET devices.

10 Claims, 2 Drawing Sheets

LINEAR POWER AMPLIFYING SYSTEM

BACKGROUND OF THE INVENTION

This application relates to a linear power amplifier including a plurality of parallel connected solid state field effect transistors or the like for dividing and carrying of power current.

Various power circuits may include solid state amplifying devices for controlling of the load current through the load device or devices. Power amplifiers using field effect transistors of the metal oxide semiconductor base, identified by the acronym MOSFET, are recognized as highly satisfactory elements for both power switching and power amplification. MOSFETs are rugged and reliable devices, and have a high input impedance permitting simplification in the gate drive circuitry. The individual devices have limited current-carrying capability, and parallel circuits are often used whereby the devices share and thereby increase the load current rating. Equal sharing of the load current between the devices is significant to prevent one device carrying all or most of the load current with a possible rapid destruction of such device. A paper entitled "Paralleling Of Power MOSFETS In Linear Applications" was presented by Kim Gauen of Motorola, Inc., Semiconductor Product Sector, Phoenix, Arizona at the April 1984 Proceedings Of PCI. The Gauen paper discusses the use of the MOSFETs in a linear application and particularly the necessity of stabilizing the operating point of the individual MOSFETs. The problems are related to the variation in the characteristic of the individual devices and particularly the variation in the current carried at a give gate voltage of the devices. The solution set forth in the Gauen paper included addition of resistance in series with the source. The paper suggests the circuit stabilizes the operating point of MOSFET devices having widely different transconductance characteristics.

In certain applications, particularly very high voltage and low current applications, the inventor has discovered that the stabilizing system of the prior art has failed to produce a reliable power supply. For example, the energization circuit of a DC krypton arc lamp in a scientific laser power supply may include a high power variable ballast element functioning as an appropriate voltage controlled current sink. The laser requires a pulsed supply and the ballast element must establish a rapid linear response to an externally applied control voltage signal. The ballast element must have a voltage rating on the order of 400 volts, in order to allow a 350 volt direct current operation with an appropriate safety margin. An efficient packaging of the ballast element for appropriate dissipation of the thermal energy is essential. Using standard technology, the inventor discovered that a ballast element in the form of a plurality of paralleled MOSFETs resulted in almost immediate failure.

There is therefore a continuing need for a power MOSFET linear amplifier which operates at a high voltage and both high and low load currents, and wherein the drain current is a function of the gate to source voltage. In addition to the specific example of a pulsed laser source, some other typical applications for a multi MOSFET linear amplifier includes voltage controlled current source, voltage controlled resistor, ultrasonic amplifier, AF and RF amplification and electronic load bank.

SUMMARY OF THE INVENTION

The inventor's analysis indicated that the pulsed operation of the arc lamp presented a load resembling a clamped inductive load with a time constant in the tens of microseconds. A high voltage, low current stress was created by the arc lamp load being unevenly distributed among the MOSFET chip devices. The inventor discovered that the MOSFET devices under the high voltage, low current operation exhibited poor current sharing, and an adverse temperature coefficient of transconductance. Even though the individual MOSFET devices had appropriate specifications under operating conditions, one or more of the plurality of devices conducted at a somewhat lower threshold voltage and once conduction was initiated, the lower threshold devices conducted substantial current while the high threshold MOSFET devices remained in a non-conducting state. In a worst case, only one MOSFET would conduct and carry the total load current, resulting in the rapid destruction of that MOSFET.

In accordance with the teaching of the present invention, the threshold voltages are controlled by controlling the effective gate-to-source resistance of the MOSFET device and thereby effectively resistively selecting a specific effective gate-to-source threshold voltage to provide a corresponding desired response of each paralleled MOSFET device. In a particularly unique construction, a trimmable balancing resistance element is connected between the gate and the source of each MOSFET device. The MOSFET devices are parallel connected and each device includes a similar gate-to-source resistor in addition to an appropriate gate resistance and source resistance. Under operating load conditions, the source-to-gate resistances are set to establish a precise and specific response to a given input voltage. Each MOSFEI device configured and adjusted in this manner is thus functionally identical to any other so configured and adjusted: these elements may then be directly paralleled with complete assurance of current sharing in linear amplifier applications.

In a preferred construction, the MOSFETs are connected in parallel circuit to form an operating module for a selected load voltage and current. The module is connected in a circuit with a gate-to-source voltage signal provided that is slightly in excess of the desired operating threshold voltage range. The gate-to-source resistances are then trimmed under actual load current conditions to adjust the voltage across the gate-to-source of the individual MOSFETs to the precise operating input voltage desired, which results in essentially simultaneous turn-on of all MOSFETs and a reliable balancing of the current between the several MOSFET devices. The modules are fabricated with a common heat sink and an appropriate packaging for rapid dissipation of the heat, to thereby maintain the necessary low operating temperature which is essential to long-term reliability of the MOSFET devices.

In a particularly satisfactory construction of the present invention, the modules are fabricated as hybrid elements incorporating a MOSFET chip mounted on a heat dissipating substrate which draws the heat from the chip for transfer to a large heat sink. The module is constructed for example to permit mounting to a water cooled heat sink. A particularly satisfactory module construction incorporates the technology set forth in several United States Patents assigned to Gentron Corporation of Milwaukee, Wisconsin and which include U.S. Pat. No. 3,958,075 which issued May 18, 1976, U.S. Pat. No. 4,218,724 which issued Aug. 19, 1980 and U.S. Pat. No. 4,488,202 which issued Dec. 11, 1984.

In one particular commercial application, an arc lamp was connected in series with a 400 volt power supply and a variable ballast element constructed in accordance with the teaching of this invention. The arc lamp provided the energy source for a laser element. The ballast element included a plurality of power hybrid multi-MOSFET linear amplifier modules, each having a drain load terminal connected in common to the arc lamp and a source terminal connected to a common circuit reference or ground. A gate terminal of each module was connected in common to a common control voltage input to create a voltage controlled current sink. Each of the power hybrid modules was constructed with eight MOSFETs connected in parallel and with each module fabricated as a hybrid circuit module, with indiviudal trimming of the MOSFETs balancing resistors such that the MOSFETs in each module equally shared currents, and the several modules similarly having essentially corresponding current sharing characteristic. Thus the load current was essentially equally distributed between the MOSFETs of the multiple modules. The ballast element was found to produce a highly satisfactory pulsed energization of the arc lamp. The present invention thus provides a method and apparatus for the construction of paralleled MOSFET circuits and particularly modules which can be parallel connected to meet the various requirements for power linear amplifiers.

BRIEF DESCRIPTION OF DRAWINGS

The drawings furnished herewith illustrate the best mode presently contemplated by the inventor in carrying out the invention.

In the drawings.

DESCRIPTION OF ILLUSTRATED EMBODIMENT

Figure 1:
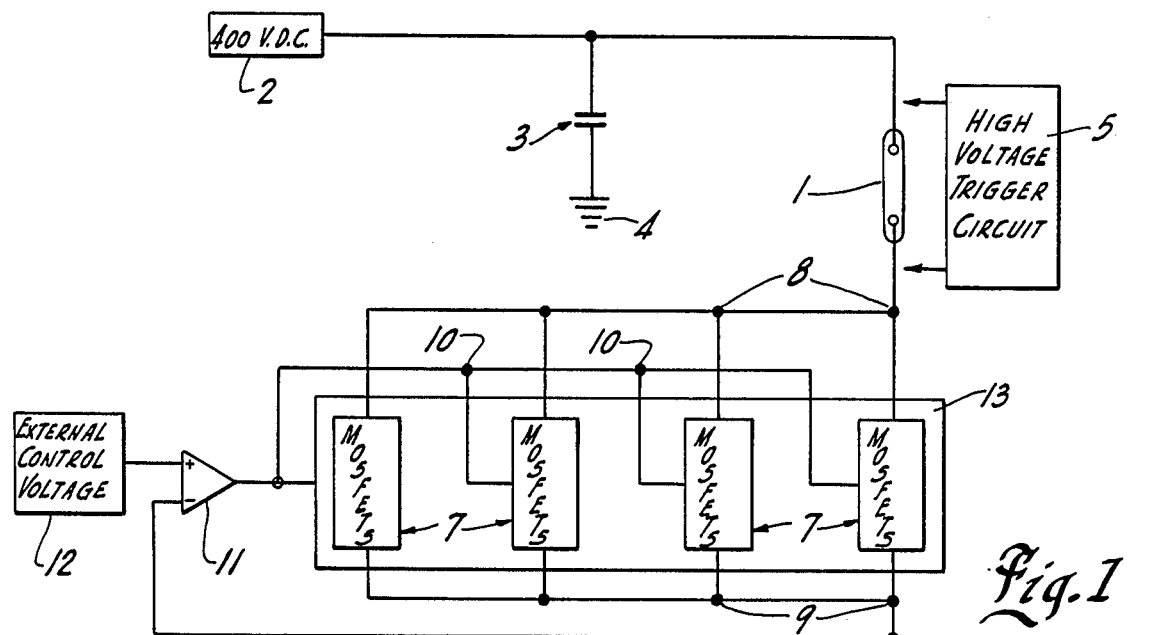
FIG. 1 is a block diagram of a power supply for an arc lamp and including a voltage controlled ballast unit consisting of four three-terminal power MOSFET amplifiers connected in parallel.

Referring to the drawing and particularly to FIG. 1., a laser power supply is illustrated for operating of an arc lamp 1 for energizing of a laser, not shown. The arc lamp 1 is connected to a 400 volt DC power supply 2. A capacitor bank 3 is connected from the power supply to a common ground 4 to provide a high pulsed current supply for energizing of the lamp 1, upon triggering of the lamp into conduction. A high voltage trigger circuit 5 is coupled to lamp 1 for initiating conduction through the lamp. In accordance with known construction, the high voltage trigger circuit provides for initial energization of the arc lamp 1 to provide a continuing pulsed output to the laser as controlled by an external control voltage 12. A high power ballast element 13 is connected in the series with the arc lamp 1 to the common ground or reference potential connection 4 of the circuit. A small sensing resistor 6 is connected between the ballast element 13 and the ground connection 4. The ballast element 13 includes four three-terminal voltage controlled MOSFET modules 7. The modules 7 each have first load terminals 8 connected in common to the lamp 1 and second load terminals 9 connected in common to the ground shunt resistor 6. Each of the modules includes a control voltage input terminal 10 connected in common to a coupling amplifier 11, having a positive input connected to an external control voltage 12 and the negative input connected to the shunt ground resistor 6. Each of the MOSFET modules 7 is a voltage controlled power amplifier which is specially constructed in accordance with the teaching of the present invention to provide a voltage controlled current sink. As presently described, the modules are preferably constructed as hybrid circuit elements, totally self-contained and providing for equal sharing of the lamp load current without the addition of external current controls to ensure equal distribution of the current throughout the various current carrying units of the ballast element 13.

The modules 7, which are linear MOSFET amplifiers, dissipate substantial heat and require forced cooling under normal operating conditions. The modules 7 are diagramatically shown mounted to a water cooled heat sink 13.

Figure 2:
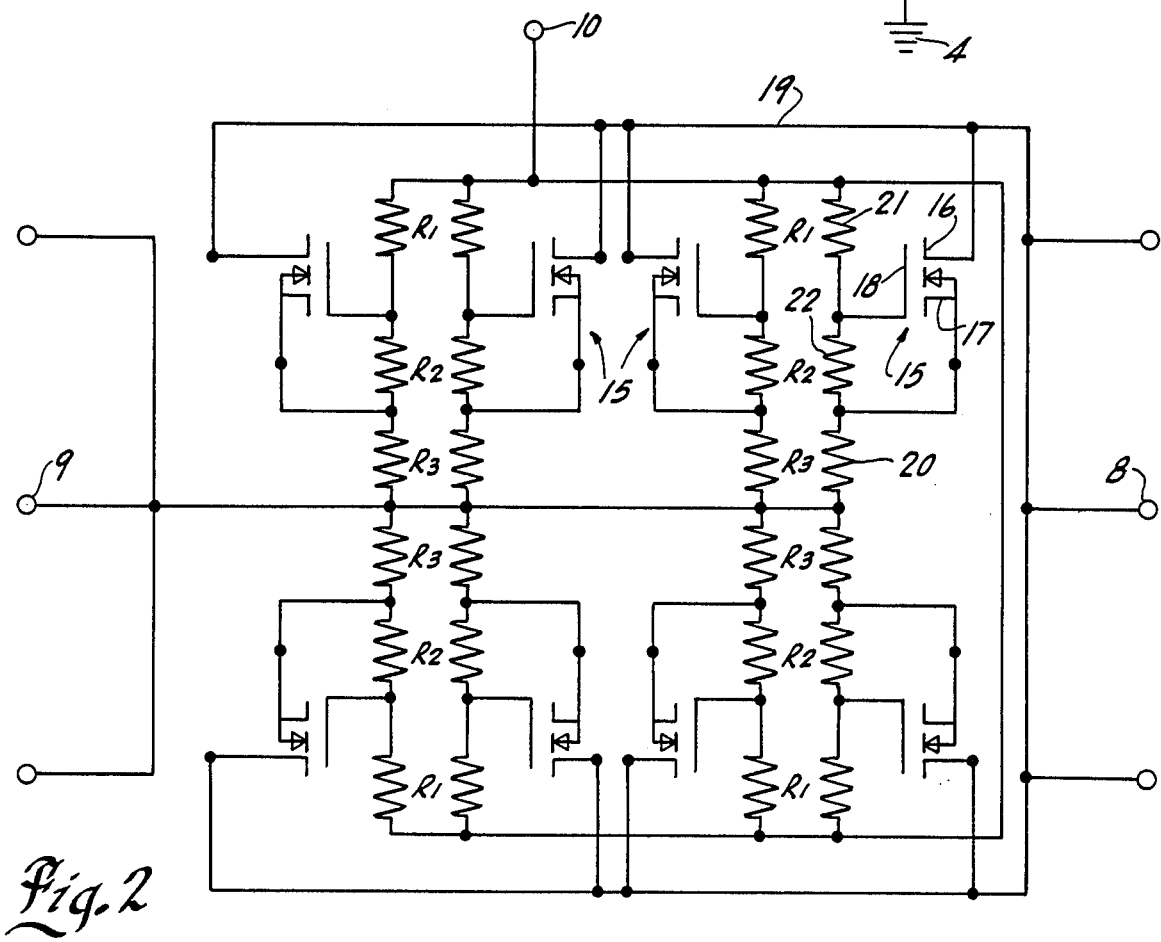
FIG. 2 is a schematic of one of the MOSFET amplifiers shown in FIG. 1 and constructed in accordance with the teaching of the present invention.

More particularly, referring to FIG. 2, a schematic circuit of one module 7 is illustrated. Each of the modules is identically formed as hereinafter described and provide essentially identical current carrying characteristics permitting the direct parallel connection as illustrated in FIG. 1.

Referring to FIG. 2, the module consists of eight MOSFETs 15 having drain terminals similarly connected to the common load drain terminal 8 and source terminals connected in common to source terminal 9 and with the gate terminals similarly connected in circuit to a common gate terminal 10. Each of the MOSFETs 15 is essentially a corresponding element and is connected into circuit through a corresponding similar resistive network. The one MOSFET shown in the upper right portion of FIG. 2 is described in detail.

The MOSFET 15 is schematically illustrated including a drain 16, a source 17 and a control gate 8. The drain and source are connected to the respective load terminals 8 and 9. The drain 16 is connected directly to a common line 19 connected to the load terminal 8, while the source 17 includes a series source stabilizing resistor 20. The resistor 20 is of a low level of resistance, and in the laser power supply was a 1 ohm, 2 percent discrete resistor. The gate 18 is connected to the control input with a series resistor 21 of a relatively high level of resistance. In the pulsed laser supply, the resistor was a 200 ohm, 5 percent resistor. The circuit described to this point is generally in accordance with known technology in the construction of power MOSFET amplifiers. As preiiously discussed, however, the inventor found that such circuitry did not operate satisfactorily in a high voltage, low current environment such as in power linear amplifier functioning as a ballast element for an arc lamp because the load current was not distributed and shared by the paralleled MOSFETs. In fact, the current flow was essentially concentrated in the MOSFETs 15 which were first to conduct as a result of varying threshold voltage characteristics. In accordance with the present invention, each MOSFET includes a balancing resistor 22 connected between the gate 18 and the source 17. The gate-to-source balancing resistor 20 functions to modify the turn-on characteristic of the MOSFET 15 and permits balancing of the current flow in the several MOSFETs 15 to establish and maintain essentially equal current distribution over the normal voltage signal range. It is important that each of the MOSFETs turn on essentially at the same time as the other MOSFETs with the signal voltage within such range, so as to initiate simultaneous conduction and establish equal current distribution through the paralleled MOSFETs. The balancing resistors 22 effectively calibrate the threshold voltage to establish and maintain such equal turn-on and thereby equal current distribution.

In fabricating the modules 7, the circuit is fabricated with the balancing resistors of corresonding nominal resistance. The module is then connected into circuit with a drain current corresponding to that of the anticipated load currents and with a voltage slightly in excess of the specified device operating voltage range for the input or control gate voltage. Typically in the laser power supply system, the control voltage applied to the gate of each MOSFET 18 will be within a range of 2 to 4 volts. The fabrication procedure will then typically operate the module with an input voltage signal of 5 volts. The resistors 22 are then trimmed under the operating load current conditions to establish the desired turn-on of all MOSFETs and establish equalized current flow in the several MOSFETs in response to the specified gate voltage.

The inventor has further found that in this process, the several modules 7 constructed as described will have essentially identical electrical characteristics, permitting direct parallel connection of the modules, such as shown in FIG. 1, with the establishment of equal current distribution between the modules as well as between the MOSFETs in the modules. The present invention thus provides a method of fabricating power MOSFET linear amplifiers which can be distributed for use by an end user in various paralleled configurations with assurance that the several modules will respond properly to distribute the load without the necessity for external controls.

Figure 3:
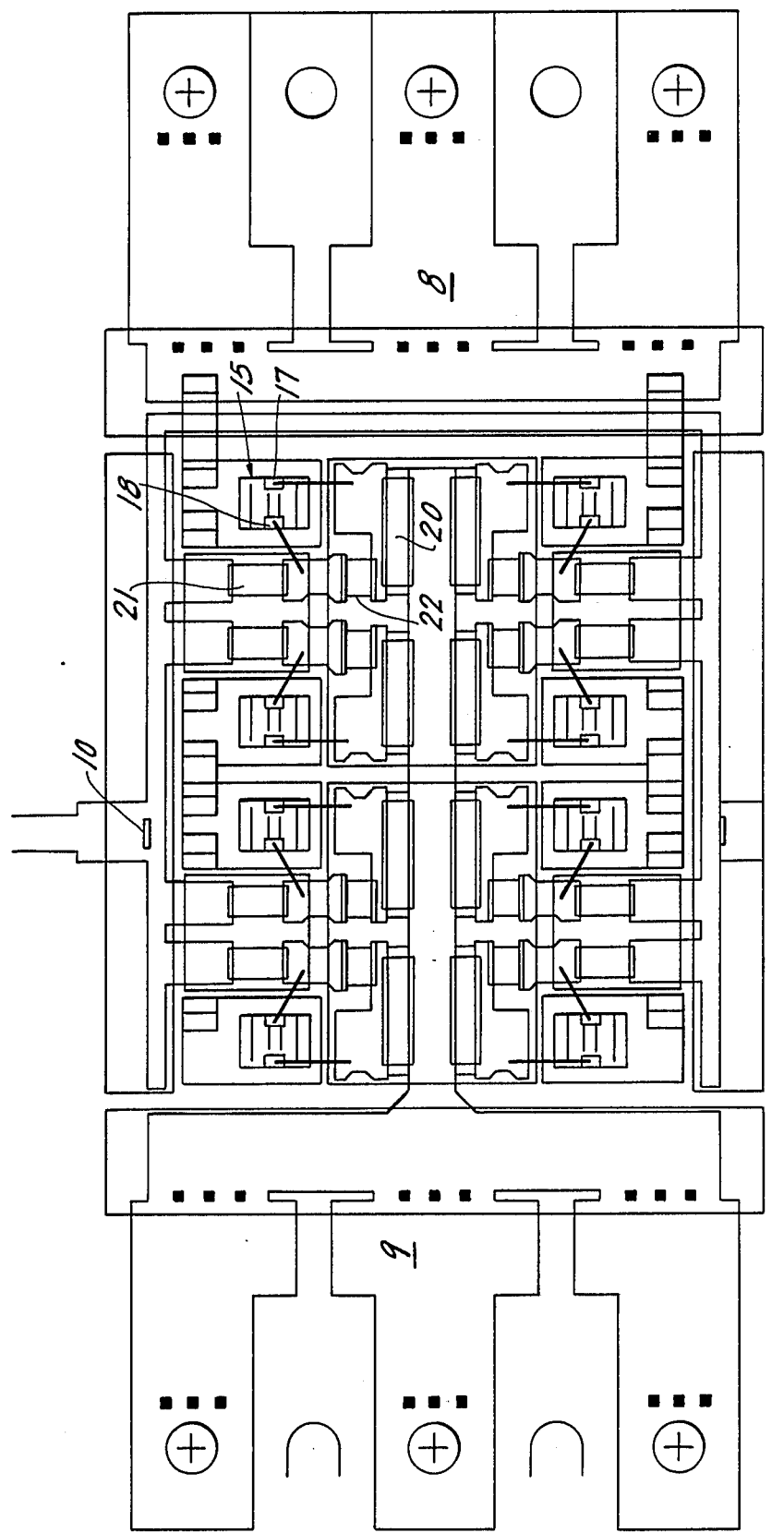
FIG. 3 is a assembly drawing of a module shown in FIG. 2.

More particularly in an optimum construction, the module is formed as a hybrid unit in accordance with the teachings of the previously-identified Gentron patents. An assembly layout for an 8 MOSFET module is shown in FIG. 3 and numbered in accordance with the numbering of FIG. 2. The individual MOSFET chips 15 are affixed to a metalized ceramic substrate with the resistors deposited as thick film resistors. The hybrid assembly before final packaging is connected into the desired operating load current test circuit with the balancing control signal applied to the gate. A laser probe is coupled to the balancing resistors 22 and the resistors 22 are trimmed to establish the proper current balance between the several MOSFETs in response to a specified gate signal.

The described embodiment of the invention has been found to provide a particularly practical commercial implementation and construction of the paralleled MOSFETs. Other methods of manufacture may of course be applied. For example, monolithic fabrication method may be employed wherein the MOSFET and the resistors are formed as an integrated monolithic chip. During the fabrication, the gate-to-source resistors are appropriately formed with a computer programmed forming of the gate-to-source resistance to establish and maintain the equalized current flow through the paralleled MOSFETs.

Although an 8 MOSFET module is illustrated, the modules may be formed with any desired number of MOSFETs depending upon the required design specification.

The present invention provides an improved power MOSFET linear amplifier which establishes a reliable and repeatable current distribution of the load current for both low and high load current conditions. A module series can be produced in which each module is correspondingly trimmed and fabricated with the balancing established under operating current conditions, such that each module properly functions with the modules connected in parallel.

Various modes of carrying out the invention are contemplated as being within the scope of the following claims and particularly pointing out and distinctly claiming the subject matter which is regarded as the invention.

I claim:

1. A power MOSFET linear amplifier, comprising:
a plurality of MOSFET devices connected in parallel, each of said devices having a drain terminal and a source terminal connected in series with a source resistor and a gate terminal connected in series with a gate resistor and having a gate-to-source resistance, a common drain line connected to each of said drain terminals, a common source line connected to said source resistors, a balancing resistor connecting said gate terminal to said source terminal, and said balancing resistors each having a resistance related to the internal gate-to-source resistance to establish essentially equal threshold voltages for the several units and thereby establish equal distribution of the total current flow between said common source line and said common drain line.

2. The linear amplifier of claim 1 including an insulating substrate, said resistors being deposited as thick film resistors and said devices being affixed on said substrate to form an integrated hybrid circuit, said balancing resistors being laser trimmed under predetermined load current conditions to establish said equal distribution of the total current flow.

3. The power amplifier of claim 1 wherein said source resistors are each essentially one ohm two percent resistors and said drain resistors are each essentially two hundred ohms five percent resistors.

4. The method of making a power MOSFET linear amplifier for operating at a high voltage and low current and having a stable temperature coefficient at said low current, comprising:
connecting a plurality MOSFET devices in parallel circuit configuration including at least one of said devices in each of a plurality of paralleled branch circuits, each of said MOSFED devices having a gate means and a drain means and a source means, load terminal means connected to said drain means and said source means, a control terminal means connected to said gate means, and a balancing resistance means connected between said gate means and said source means,
connecting said load terminal means in circuit with a power supply to establish a selected drain current,
connecting said control terminal means to an electrical control signal means for establishing said drain current, and trimming said balancing resistance means under conditions of said drain current to establish essentially equal turn-on of said devices and thereby load current flow in each of said devices.

5. The method of claim 4 wherein a plurality of said power circuits are fabricated as individual modules, each of said MOSFET devices fabricated with said balancing resistance means formed as a thick film resistor between the gate and the source, and said trimming of said balancing resistance means including laser trimming of said thick film resistors whereby each of said individual modules have essentially identical operating characteristics.

6. The method of claim 4 wherein said MOFSET devices are selected to operate within a selected narrow input threshold voltage range, operating said power circuit at a voltage slightly greater than said range, and trimming said balancing resistance means to establish a threshold voltage within said threshold voltage range.

7. The method of balancing load currents in a power circuit having parallel connected FET devices each having a gate and a source and a drain and each having a balancing resistor connected between the gate and source, comprising operating said power circuit under load conditions, and adjusting the ohmic values of said balancing resistors while under said load conditions to establish balanced current distribution through said FET devices.

8. In a pulsed power circuit having a pulsed inductive load means connected in series with a high power variable ballast element, said ballast element comprising a plurality of power hybrid modules each having load terminals connected in common to said load means and to a common reference connection and a control terminal connected in common to a common control connection, each of said power hybrid modules having essentially corresponding current sharing characteristics and each of said modules comprising a plurality of parallel connected MOSFETs, each of said MOSFETs having a drain connected in common to one of said load terminals and having a source connected in series with a source resistor to a source common connected to the other of said load terminals and each having a gate connected in series with a gate resistor to a gate common connected to the control terminal, each of said MOSFETs including a balancing resistor connected between said gate and said source and each resistor having a resistance to establish simultaneous turn-on and essentially balance current flow through said MOSFETs.

9. The pulsed power circuit of claim 8 wherein said power circuit operates at 400 volts DC and a maximum 32 amperes per module.

10. A power MOSFET comprising,
a MOSFET chip adapted to be connected in parallel and having a drain terminal and a source terminal connected in series with a source resistor and a gate terminal connected in series with a gate resistor and having an internal gate-to-source resistance, a balancing resistor connecting said gate terminal to said source terminal to form a circuit unit, and said balancing resistor having a resistance related to the internal gate-to-source resistance to establish a predetermined threshold voltage for the chip, and said chip connected in circuit with other similar chips each having a similar balancing resistor and with said chip and said other similar chips connected in parallel and with a common input signal connected to each of said gate resistors to establish equal distribution of the total current flow.

* * * * *

UNITED STATES PATENT AND TRADEMARK OFFICE
CERTIFICATE OF CORRECTION

PATENT NO. : 4,779,060
DATED : October 18, 1988
INVENTOR(S) : James Henden It is certified that error appears in the above-identified patent and that said Letters Patent is hereby corrected as shown below:

Column 6, line 57, "MOSFED" should read --MOSFET--.

Column 7, line 14, "MOFSET" should read --MOSFET--.

Signed and Sealed this

Sixteenth Day of January, 1990

*Attest:*

JEFFREY M. SAMUELS

*Attesting Officer*     *Acting Commissioner of Patents and Trademarks*